(12) United States Patent
Boerner

(10) Patent No.: US 8,610,115 B2
(45) Date of Patent: Dec. 17, 2013

(54) ORGANIC ELECTROLUMINESCENT DEVICES

(75) Inventor: Herbert F. Boerner, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 40 days.

(21) Appl. No.: 13/509,877

(22) PCT Filed: Nov. 17, 2010

(86) PCT No.: PCT/IB2010/055216
§ 371 (c)(1),
(2), (4) Date: May 15, 2012

(87) PCT Pub. No.: WO2011/064692
PCT Pub. Date: Jun. 3, 2011

(65) Prior Publication Data
US 2012/0228599 A1 Sep. 13, 2012

(30) Foreign Application Priority Data
Nov. 27, 2009 (EP) .................................. 09177346

(51) Int. Cl.
*H01L 33/36* (2010.01)
*H01L 51/52* (2006.01)
(52) U.S. Cl.
USPC ................ 257/40; 257/99; 257/E33.062
(58) Field of Classification Search
USPC .................................................. 257/40, 99
See application file for complete search history.

(56) References Cited

U.S. PATENT DOCUMENTS

| 6,013,538 A * | 1/2000 | Burrows et al. .......... 438/22 |
| 7,348,724 B2 | 3/2008 | Lee |
| 2009/0127546 A1 * | 5/2009 | Hild et al. ................ 257/40 |

FOREIGN PATENT DOCUMENTS

| EP | 1191592 A2 | 3/2002 |
| EP | 1202329 A2 | 5/2002 |
| JP | 11054287 | 2/1999 |
| JP | 2004214084 | 7/2004 |
| WO | 2007135603 A1 | 11/2007 |
| WO | 2008072148 A2 | 6/2008 |

* cited by examiner

*Primary Examiner* — Evan Pert
(74) *Attorney, Agent, or Firm* — Mark L. Beloborodov

(57) ABSTRACT

This invention relates to an organic electroluminescent device (1) produced with less effort comprising a substrate (2), a substrate electrode (3) on top of the substrate (2), an electroluminescent layer stack (4) with at least one organic light emitting layer on top of the substrate electrode (3), a counter electrode (5) at least covering the electroluminescent layer stack (4), and a short prevention layer (6) covering the counter electrode (5) establishing a double layer (DL) of counter electrode (5) and short prevention layer (6), and an electrically isolating layer at least partly on top of the short prevention layer, where a tensile stress (TS) is induced to the double layer (DL) by the short prevention layer (5) suitable to roll-up (10) the double layer (DL) after deposition of the electrically isolating layer (8) adjacent to a cut introduced at least to the double layer (DL) in an area, where the double layer (DL) is arranged on top of the electroluminescent layer stack (4) suitable to electrically disconnect the counter electrode (5) from the substrate electrode (3), where the electrically isolating layer (8) at least partly covers the area of the double layer with introduced cut (7) to partly dissolve the electroluminescent layer stack (4) to weaken the adhesion of the double layer to the electroluminescent layer stack adjacent to the cut to roll-up the double layer in the vicinity of the cut. The invention further relates to a method of manufacturing such an OLED device.

17 Claims, 2 Drawing Sheets

ORGANIC ELECTROLUMINESCENT DEVICES

FIELD OF THE INVENTION

The invention relates to an OLED devices produced with less effort and to a method of manufacturing such an OLED devices.

BACKGROUND OF THE INVENTION

Organic electroluminescent devices (OLEDs) comprise very thin layers of organic substances on top of a glass substrate covered with an electrically conducting but optically transparent oxide, usually Indium-Tin oxide (ITO). ITO forms the substrate electrode, usually the anode and a layer of Aluminum (100 nm) evaporated on top of the organic layer stack forms the counter electrode, usually the cathode. When a voltage between 2 and typically 5 V is applied between the electrodes, current is injected into the organic layers and light is generated. The preparation of OLEDs requires structuring of all individual layers to provide a reliable operation over time, in particular to operate the OLEDs, both electrodes have to be electrically isolated from each other. Therefore at least three masks processes are commonly required: structuring of the substrate electrode deposited on top of the substrate (first mask process), depositing the organic layer stack on top of the pre-structured substrate electrode (second mask process different to the first mask process) and depositing the counter electrode on top of the organic layer stack without providing an electrical contact to the substrate electrode (third mask process different to first and second mask process). The mask processes apply so-called shadow masks having different geometries in order to cover the desired areas with the layer to be deposited and simultaneously shielding the other areas in order to avoid material deposition there. The application of shadow masks for deposition (coating) processes is expensive, because the masks have to be manufactured with high geometric accuracy. Furthermore masks will be coated with the deposited material and have to be cleaned periodically. Misalignments of masks may lead to deposition failures making the operation of OLEDs impossible, e.g. by electrically shortened electrodes due to a misalignment of the counter electrode mask. A lot of additional measures have to be applied in order to achieve a reliable coating process making this process very expensive, see for example EP 1202329 A2. All these measures result in a manufacturing process requiring an enormous effort to achieve a good production yield (low failure ratio).

SUMMARY OF THE INVENTION

It is an object of the present invention to provide a reliable organic electroluminescent device, which could be manufactured with less manufacturing effort and a method to manufacture such a device with a reduced failure ratio.

The object is solved by an organic electroluminescent device comprising a substrate, a substrate electrode on top of the substrate, an electroluminescent layer stack with at least one organic light emitting layer on top of the substrate electrode, a counter electrode at least covering the electroluminescent layer stack, and a short prevention layer covering the counter electrode establishing a double layer of counter electrode and short prevention layer, and an electrically isolating layer at least partly on top of the short prevention layer. A tensile stress is induced in the double layer by the short prevention layer which is suitable to roll-up the double layer after deposition of the electrically isolating layer adjacent to a cut introduced at least to the double layer in an area, where the double layer is arranged on top of the electroluminescent layer stack. The cut is suitable to electrically disconnect the counter electrode from the substrate electrode, where the electrically isolating layer at least partly covers the area of the double layer with the introduced cut to partly dissolve the electroluminescent layer stack at the cut, weakening the adhesion of the double layer to the electroluminescent layer stack adjacent to the cut to roll-up the double layer in the vicinity of the cut.

The organic electroluminescent device according to the present invention allows the preparation of a functional layer stack of electroluminescent layer stack and counter electrode and short prevention layer using only one shadow mask for preparing the electroluminescent layer stack. The layers on top of the electroluminescent layers stack are prepared without shadow masks resulting in a cheaper manufacturing process with increased reliability, especially against the occurrence of shorts between substrate electrode and counter electrode.

The substrate electrode may occupy a large area of the substrate. The electroluminescent layer stack on top of the substrate electrode covers only a part of the substrate electrode. The counter electrode on top of the electroluminescent layer stack preferably fully covers the area of the electroluminescent layer in order to be able to apply a driving voltage to the entire electroluminescent layer stack to operate the organic electroluminescent device. The avoidance of a shadow mask for depositing the counter electrode leads to a deposition area of the counter electrode extending over the substrate electrode. Therefore the term "at least covering the electroluminescent layer stack" denotes, that at least parts of the substrate electrode may be covered by the counter electrode outside the area, where the electroluminescent layer stack is present. Without any additional measure, such a device would not be operational, since both electrodes are electrically connected.

To prepare the organic electroluminescent device for being ready to emit light, counter electrode and substrate electrode are separated from each other by a cut introduced into the counter electrode (and all other layers deposited on top of the counter electrode). The term "at least to the double layer" denotes the requirement to at least separate the counter electrode area on top of the electroluminescent layer stack (first area) from the surrounding counter electrode area (second area) in direct contact to the substrate electrode. The cut may further divide the electroluminescent layer stack or parts of the electroluminescent layer stack into two separated areas, one located underneath the first area and the other area at least partly located underneath the second area. The cut may separate both areas (first and second) of the counter electrode from each other sufficient to prevent a short between counter and substrate electrode. However, the edges of the cut and therefore the edges of the counter electrode along the cut may be jagged or otherwise deviating from an ideal straight line. Such an edge of the counter electrode may comprise sharp spikes or edges leading to a steep increase of the local field strengths in the vicinity of the edge of the cut. The increased filed strength may cause a short. To fully avoid the risk of shorts, the edges of the counter electrode have to be removed from the vicinity of the cut. A short prevention layer prepared on top of the counter electrode induces tensile stress to the layer system of counter electrode and short prevention layer. This enables the adjustment of the tensile stress of the double layer of counter electrode and the short prevention layer adhering to the counter electrode to be suitable to roll-up the double layer along the cut as a result of a weakened adhesion of the counter electrode to the organic electroluminescent layer stack along a cut. Here the term "roll-up" denotes the rolling-in or curling of the double layer analogue to a paper on a paper role. The roll-up of the double layer prevents shorts between counter electrode and substrate electrode due to the absence of the counter electrode adjacent to the cut. A flat counter electrode is still present as desired on non-disturbed organic electroluminescent layer(s). The term "double layer" shall denote a layer stack, where two essential components (counter electrode and short prevention layer) are present. The term "double layer" explicitly includes the possibility of additional layers between counter electrode and short prevention layer. Here the counter electrode shall be understood in a functional component to apply a voltage to the organic electroluminescent device. The counter electrode may be a layer or a layer stack of one or more layers required to establish a certain electrical conductivity to be able to act as an electrode. The short prevention layer shall be understood in a functional component to induce a certain tensile stress to the counter electrode, where the short prevention layer adheres to. The short prevention layer may be a layer or a layer stack of one or more layers required to induce a certain tensile stress.

The short prevention layer is deposited by vacuum evaporation inducing a tensile stress in the double layer of counter electrode and short prevention layer. The tensile stress is present at room temperature after deposition achieving the desired roll-up behavior of the double layer in the vicinity of the cut without any further heat treatment. The roll-up behavior will prevent shorts along the cut. Therefore shorts are prevented before and during operating of the organic electroluminescent devices avoiding any leakage currents along the cut(s) subsequently avoiding any aging effects caused by these leakage currents.

Commonly stress in layers manifests itself most obviously in the bending of a very thin substrate on which it is deposited. A number of different methods has been used to measure the bending of such thin substrate as an indication the present stress of the deposited layer. The most general arrangement is to use a thin strip of glass, clamped at one end to form a cantilever, onto which the film is deposited. The deflection of the free end, as the strip becomes bent, is then maesured e.g by direct optical observation of the free end with a microscope, measurement of the electrical capacity formed between the flexible strip and a fixed conducting plate held parallel and close to it or by electromeachanical measurements of the deflection using a stylus pick-up touching the free end. As an example, evaporated aluminum layer (e.g. as counter electrodes) exhibit a high tensile stress at layer thicknesses below 10 nm. Al layers with such thin layer thickness do not have a sufficient electrical conductivity to be applied as electrodes. Also the surface tension of thin Al layers tend to build Al islands instead of continuos layers of Al. Al electrodes of commonly 20 nm thickness or more build homogeneous layers exhibiting nearly no stress or a weak comprehensive stress. The required tensile stress suitable to roll-up the counter electrode has to be induced by an additional layer prepared on top of the counter electrode and sufficiently adhering to the counter electrode.

In order to obtain a roll-up behavior of the double layer along the cut, the electrically isolating layer partly dissolves the electroluminescent layer stack in the vicinity of the cut. The term "partly" denotes a dissolving process, which occurs only in the vicinity of the cut. Furthermore, the dissolving process only applies to one or some layers of the electroluminescent layer stack. Therefore the electrically isolating layer has to cover at least the area, where the cut is present, to initiate the desired dissolving process. Alternatively the electrically isolating layer may cover the entire stack of layers deposited on top of the substrate electrode. The material of the electrically isolating layer has an electrical resistance that is at least as high as the electrical resistance of the organic layer stack between counter and substrate electrode, so that no leakage currents between the electrodes will flow through the insulating layer. The electrically isolating layer prevents the occurrence of shorts for the entire organic electroluminescent device making additional short prevention measures obsolete.

The terms "vicinity" and "adjacent" denotes the lateral extension from the cut in the order of 1 mm or a few millimeter.

The cut may be introduced to the organic electroluminescent devices by any suitable technique within the scope of this invention, preferably by mechanical cutting and/or laser cutting, more preferred by laser ablation of at least the counter electrode.

Furthermore the counter electrode present in the second areas (in direct contact to the substrate electrode) improves the electrical conductivity of the substrate electrode partly, which leads to a more homogeneous current distribution over the light emitting area and therefore to a more homogeneous brightness distribution.

In an embodiment the cut forms a closed line within the area of the double layer, preferably arranged close to the outer edge of the area covered by the electroluminescent layer stack. The cut separates one light emitting area inside the closed line from a non-emitting area outside the closed line by wasting as less light emitting material as possible located at the non-emitting area outside the closed line. The cut is located inside the area covered by the electroluminescent layer stack, but close to its border.

The term "close" denotes the lateral extension from the border of the area covered by the electroluminescent layer stack cut in the order of 1 mm or a few millimeter.

In another embodiment the counter electrode may be divided by cuts into more than two separate regions in order to structure the counter electrode. The separated counter electrode areas may be operated independently from each other by contacting the separated counter electrode areas from the back side (from the side where the counter electrode in located) of the organic electroluminescent device.

In an embodiment the short prevention layer is made of at least one material of the group of manganese, copper, magnesium fluoride or silver, or alloys comprising these materials or combinations thereof having a suitable tensile stress to show the desired roll-up behaviour after being deposited on top of the organic electroluminescent layer(s) by vacuum evaporation.

The organic electroluminescent device (OLED device) can be any OLED device known to the skilled person. In further embodiments the OLED device of the present invention is used as or comprised by a light source, a lamp, or is comprised by a monitor, switch or display. Thus, also a light source, a lamp, a monitor, a switch and a display comprising the inventive EL device are encompassed by the present invention. In the following the basic structure of an OLED device is described exemplarily.

The substrate can have any suitable geometry, shape or form but is preferably flat and may, if a flexible material is utilized, be shaped or bent into any three-dimensional shape that is required. In preferred embodiments of the invention the substrate is made from glass, plastics, or ceramics. Further preferred materials for the substrate comprise polymer sheets or foils, more preferably with a suitable moisture and oxygen barrier to essentially prevent moisture and/or oxygen entering the OLED device. The substrate may further comprise additional layers, e.g. for optical purposes such as light out-coupling enhancement and the like.

The substrate preferably is transparent and can comprise any suitable material known to the skilled person. In the present invention the term "transparent" refers to the transmission of in the visible range of ≥50% light in the given material, e.g. the substrate or the electrode. The remaining light is thus either reflected and/or absorbed. "Transparent" includes "semi-transparent" referring to a material that exhibits a transmission of light in the visible range of between ≥10% and <50%. Thus, whenever reference is made to a "transparent" material this also explicitly discloses a "semi-transparent" material if not stated otherwise. Preferably light in the visible range has a wavelength of between ≥450 nm and ≤700 nm. Thus, for example, a transparent substrate or electrode absorbs and/or reflects less than 50% of the incident light.

The substrate electrode can be made from any suitable material known to the skilled person. In a preferred embodiment the substrate electrode is a transparent electrode. In a further preferred embodiment of the invention the substrate electrode comprises a transparent conducting oxide (TCO), more preferably indium-tin oxide (ITO), ZnO, or doped ZnO. Optionally the substrate electrode is undercoated with SiO2 and/or SiO to advantageously suppress diffusion of mobile atoms or ions from the substrate into the electrode. Electrodes comprising a TCO preferably have a transparency of ≥60% and ≤100%, more preferably of ≥70% and ≤90% and most preferably of about 80%.

In the context of the invention the notion electroluminescent layer stack denotes also all layers prepared between the substrate electrode and the counter electrode. In one embodiment of an EL layer stack, it comprises at least one light emitting organic electroluminescent layer prepared between substrate and counter electrode. In other embodiments the layer stacks may comprise several layers prepared between substrate and counter electrode. The several layers may be organic layers, such as one or more hole transport layers, electron blocking layers, electron transport layers, hole blocking layers, emitter layers or a combination of organic and non-organic layers. The non-organic layers may be additional electrodes in case of two or more light emitting layers within the layer stack and/or charge injection layers. The organic electroluminescent layer or organic electroluminescent layer stack in case of more than one organic layer can be any layer or stack known to the skilled person and/or suitable for an OLED device. As described above an electroluminescent layer stack comprises at least one EL emitter layer comprising EL molecules. A single EL emitter layer preferably has a thickness of about 10 nm.

Preferred organic electroluminescent layer stacks comprise more than one light-emitting layer, each comprising at least one type of electroluminescent molecule. Preferably, the light-emitting layers emit light of different colors. This is especially advantageous if color tunable OLED devices are required. In a further embodiment of the invention the organic electroluminescent layer stack comprises at least two light-emitting layers having different emission colors. This means that if the OLED device of the present invention is induced to emit light by application of electric voltage/current each of the at least two emission layers will emit light at a different wavelength. Different emission colors are usually achieved by use of different EL molecules that are comprised by the EL emission layers. Each EL emission layer can comprise a single or, more than one type of EL molecules. In more preferred embodiments, the EL stack comprises three EL emission layers emitting red, green and blue light, respectively.

The electroluminescent layer stack may comprise one organic electroluminescent layer or multiple organic electroluminescent layers denoted as organic electroluminescent layer stack. However, various other basic structures of OLED devices are known to the skilled person, all of which are meant to be encompassed by the present invention. An exemplary basic OLED device comprises a substrate electrode as an anode usually disposed on a substrate such as glass or flexible polyethylene terephtalate (PET) foil. On top of the transparent substrate electrode, the organic layer(s) are disposed comprising at least one emitter layer comprising at least one type of electroluminescent (EL) molecules. The counter electrode, usually the cathode, is disposed on top of said organic layer stack. The skilled person will be aware of the fact that various other layers may be incorporated for the production of such an OLED device, for example, a hole transport layer that may contact the anode, an electron transport layer that may contact the cathode, a hole injection layer—preferably made from poly(3,4-ethylendioxythiophene)/polystyrolsulfonate (PEDOT/PSS)—disposed between the anode and the hole transport layer and/or a electron injection layer—preferably a very thin layer made from lithium fluoride, or cesium fluoride—disposed between the electron transport layer and the cathode. Furthermore, it is known to the skilled person that OLED devices may comprise an organic layer stack wherein more than one emitter layer is present.

In one embodiment the organic light emitting layer(s) comprise organic light-emitting molecules such as polymers (PLEDs) or small molecules (SMOLEDs) to emit light. In another preferred embodiment, the OLED device is a phosphorescent organic light-emitting diode (PHOLED) device. The present invention is not restricted to specific organic molecules provided such are suitable for the use as electroluminescent molecules in OLED devices. Various organic light-emitting molecules are known to the skilled person, all of which are meant to be encompassed by the present invention. As used in the present invention "light-emitting molecules" preferably mean "organic electroluminescent molecules". In preferred embodiments the polymers of a PLED are conjugated polymers such as derivates of poly(p-phenylen-vinyls) (PPV) and the small molecules of an SMOLED are organometallic chelates, such as for example Alq3, and/or conjugated dendrimers.

In the context of the invention the notion counter electrode denotes an electrode away from the substrate. The counter electrode of common organic electroluminescent devices is usually non-transparent and made of Al or Ag layers of sufficient thickness such that the electrode is reflecting (typically 100 nm for Al and 100-200 nm for Ag). It is usually the cathode, but it can also be biased as the anode. For top-emitting or transparent electroluminescent devices the counter electrode has to be transparent. Transparent counter electrodes are made of thin Ag or Al layers (5-15 nm) or of ITO layers deposited on top of the other previously deposited layers. In a preferred embodiment of the present invention, the thickness of the counter electrode is below 140 nm, preferably between 10 and 100, more preferably between 20 and 80 nm, even more preferred between 30 and 50 nm in order to be able to be rolled-up by the short prevention layer.

The electrodes can be connected to a voltage/current source via electrical conductors.

The electroluminescent device according to the invention comprises an encapsulation means to encapsulate the electroluminescent layer stack. The encapsulation means may also encapsulate the whole stack of layers of the electroluminescent device or just a plurality of layers, forming a part of the whole stack of layers. Preferably, the encapsulation means is a gas-tight means, covering at least the organic electroluminescent layer and the counter electrode. By using a gas-tight encapsulation means, it is prevented that environmental factors like water, or oxygen can damage the encapsulated layers. The encapsulation means may form a gas-tight lid. This lid may be formed of glass or metal. It is also possible to form the encapsulation means by one or a plurality of layers applied to the electroluminescent device or just parts of it. The layers may comprise silicon, silicon oxide, silicon nitride, aluminum oxide or silicon oxinitride. All the named encapsulation means prevent mechanical and/or environmental factors from affecting the layer stack of the electroluminescent device adversely. As an example, the encapsulation means can be made of metals, glass, ceramics or combinations of these. It is attached to the substrate by conductive or non-conductive glue, melted glass frit or metal solder. Therefore, it may also provide mechanical stability for the electroluminescent device.

In another embodiment the short prevention layer has a layer thickness adapted to provide the suitable stress to roll up the counter electrode adjacent to the cut after deposition of the isolating layer, preferably a layer thickness of more than 20 nm, more preferred more than 40 nm, even more preferred more than 60 nm. The thicknesses shall not exceed a thickness, where the tensile stress initiates a roll-up of the double layer at non-disturbed areas (areas, where no cut is present). The thickness is one parameter enabling the adjustment of the tensile stress to the desire value, where the double layer adheres to the organic layers underneath, when no cut is present and where the double layer shows the roll-up behavior in the vicinity of the cut, where the adhesion to the organic layers underneath is weakened by the isolation layer. People skilled in the art are able to adjust the layer thickness of the applied short prevention layer to the required thickness depending on the layer stack (materials and/or layer thicknesses and/or preparation conditions) underneath the short prevention layer within the scope of this invention.

The electrically isolating layer is deposited on top of the short prevention layer at least partly covering the short prevention layer. The material of the electrically isolating layer has an electrical resistance that is at least as high as the electrical resistance of the organic layer stack between counter and substrate electrode, so that no leakage currents between the electrodes will flow through the insulating layer. The thickness of the at least partially deposited isolating layer should be larger than the electroluminescent layer stack in order to be able to fill the entire region of the cut, e.g. thicknesses of at least 1 micrometer, preferably at least 1.5 micrometer, more preferred at least 2 micrometer, even more preferred more than 5 micrometer. A larger layer thickness (e.g. more than 10 micrometer) also improves the robustness of the electroluminescent layer stack against mechanical contact, e.g. with a cover lid encapsulating the OLED device in order to protect the OLED device against environmental gases to provide OLED device with lifetimes of more than 10000 h. A significant reduction of the emitted light of the organic electroluminescent devices of about a factor of 2 or more shall be understood as end of life.

In a preferred embodiment the electrically isolating layer is a polymer layer, preferably polymer layer comprising solvents or reactive components. Such polymer layers weaken the adhesion of the counter electrode to the uppermost organic layer of the organic electroluminescent layer stack by locally destroying the organic layers. After application, these polymers have to be hardened or cured, which can be achieved by evaporation of the solvents or by reaction of the components. The hardening process may be initiated or accelerated by heat or by application of UV light.

The invention further relates to method to manufacture an organic electroluminescent device according to the present invention, comprising the step of
 providing a substrate covered with a substrate electrode,
 depositing a electroluminescent layer stack on top of the substrate electrode partly covering the substrate electrode, preferably with a mask defining the substrate electrode area being covered by the electroluminescent layer stack,
 depositing a counter electrode at least covering the electroluminescent layer stack,
 depositing a short prevention layer on top of the counter electrode introducing a tensile stress to a double layer of counter electrode and short prevention layer suitable to roll-up the double layer adjacent to a cut introduced at least to the double layer,
 introducing the cut to at least the double layer in an area, where the double layer is arranged on top of the electroluminescent layer stack, preferably close to the outer edge of the area of the electroluminescent layer stack,
 depositing an electrically isolating layer on top of the double layer at least covering the area of the double layer, where the cut was introduced,
 dissolving the electroluminescent layer stack arranged between substrate electrode and counter electrode adjacent to the cut by the previously deposited electrically isolating layer to weaken the adhesion of the double layer to the electroluminescent layer stack adjacent to the cut,
 rolling-up of the double layer in the vicinity of the cut, and
 hardening or curing of the electrically isolating layer.

In an embodiment of the method, the step of introducing the cut comprises mechanical cutting and/or laser cutting, preferably laser ablation of at least the double layer. As an example mechanical cutting can be executed with high accuracy manually by a scalpel. Alternatively, the mechanical cutting process may be executed automatically by a suitable cutting machine. Alternatively, methods like laser cutting are contactless techniques enabling to cut the whole layer stack or only some layers leaving the other layers underneath as prepared depending on the desired cut depth. Also the shape of the cut and the shape of the cutting line can be adjusted as desired by the applied laser parameter such as focus diameter, laser power, process speed and process intervals (like double scanning etc.). A laser cut can be prepared very fast improving the manufacturing speed for an organic electroluminescent device. In a preferred embodiment, laser ablation (a special field of laser cutting) can be applied, if the cut shall penetrate only through a few layers leaving the other layers underneath undamaged.

In a preferred embodiment of the method, the cut forms a closed line within the area of the double layer, preferably arranged close to the outer edge of the area covered by the electroluminescent layer stack.

The deposition of the layers of the electroluminescent layer stack can be carried out by any suitable means. A group of preferred deposition techniques widely known to the skilled person are the vapor deposition techniques. Such techniques comprise chemical vapor deposition (CVD), such as low pressure CVD (LPCVD) or physical vapor deposition (PVD), such as sputtering or electron-beam evaporation. In a preferred embodiment, the short prevention layer is deposited by vacuum evaporation, which provides layers with easily reproducible stress conditions, when deposited on top of a substrate previously covered with other layers. The short prevention layer typically is deposited on a substrate kept at room temperature, using directly or indirectly heated crucibles. The deposition rates for copper and manganese range between 0.1 and 1 nm per second. The electrically isolating layer is deposited at room temperature under environmental conditions, e.g. ambient pressure. The deposition may be performed in dry atmosphere, preferably dry nitrogen atmosphere. The possibility to apply the isolating layer after depositing the complete electroluminescent layer stack lowers the process costs, also the application of the isolating layer in form of a liquid is possible. The electrically isolating layer preferably fully covers the counter electrode and the short prevention layer. In a preferred embodiment the electrically isolating layer is deposited by spray coating or by printing, preferably by screen or tampon printing. The advantage of spray coating is to apply a fast, simple and cheap technology. Also the deposition rate is high enabling to deposit a layer with thicknesses in the micrometer range. The material of the electrically isolating layer may be a polymer, preferably a polymer comprising solvents or reactive components (e.g. a two-component mixture) suitable for thermal and/or ultra violet curing in order to solidify the isolating layer. A two-component mixture comprises in this case a hardener and a binder. The advantage lies in the fact that the isolating layer solidifies by itself without a further process step. Such polymers weaken the adhesion of the counter electrode to the uppermost organic layer of the organic electroluminescent layer stack by dissolving locally the organic layers.

In a preferred embodiment of the method the electrically isolating layer is fully covering the counter electrode and the short prevention layer. In this case, a cut can be introduced to the stack of layers at any location as desired. An electrically isolating layer applied only partly would limit the number of cuts and the shape of cuts to the areas covered by the electrically isolating layer. A fully covered electroluminescent device provides the largest range of variations to the applied cuts. One single device can be modified to differently structured products just applying the cut where needed on demand.

The invention further relates to the use of a short prevention layer, preferably made of copper or manganese, in organic electroluminescent devices according to the present invention having a tensile stress suitable to roll-up a double layer of counter electrode and short prevention layer in the vicinity of a cut after partial dissolving the at least one organic electroluminescent layer arranged between substrate electrode and counter electrode in a vicinity of the cut to prevent shorts between the counter electrode and a substrate electrode before initial start-up of the organic electroluminescent devices.

The use of the short prevention layer to prevent shorts along the cut is easily applicable to any kind of OLED devices and advantageous compared to alternative solutions. Also shorts are prevented before operating the organic electroluminescent devices avoiding any leakage currents and subsequently avoiding any aging effects of the electroluminescent layer stack caused by these leakage currents.

Preferred embodiments of the method according to the invention will be readily apparent to the skilled person when reading the description regarding the OLED device above. However, in the following some of the preferred embodiments will explicitly be disclosed.

BRIEF DESCRIPTION OF DRAWINGS

These and other aspects of the invention will be apparent from and elucidated with reference to the embodiments described hereinafter.

In the drawings.

DETAILED DESCRIPTION OF EMBODIMENTS

Figure 1:
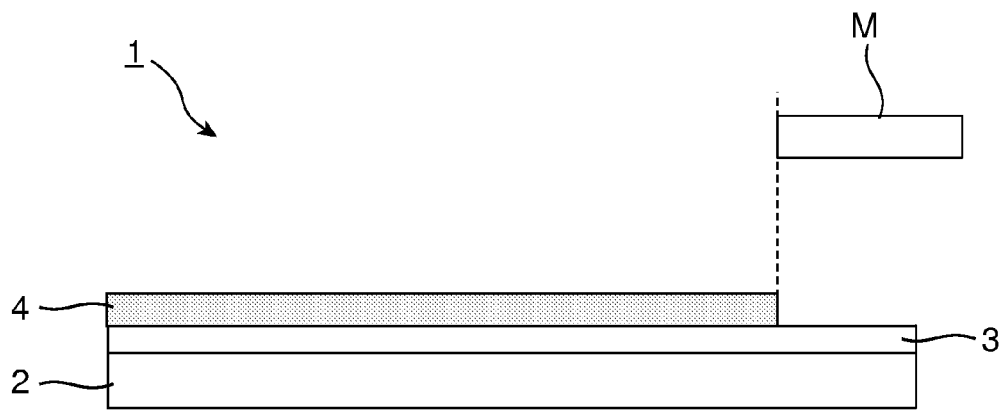
FIG. 1 step of depositing the electroluminescent layer stack during manufacturing of an organic electroluminescent device according to the present invention.

FIG. 1 is a schematic cross-sectional view of an organic electroluminescent (OLED) device after deposition of the electroluminescent layer stack. At this state of production the OLED device comprises for example a flat glass substrate 2 onto which a transparent ITO anode of a layer thickness of 120 nm as the substrate electrode 3 has been deposited by sputtering or CVD. On top of the substrate electrode 3 an organic electroluminescent layer stack 4 to emit light is deposited by vacuum evaporation comprising a 25 nm thick hole injection layer of NHT-5 α-NPD doped with 4% F4-TCNQ, a 10 nm thick hole transport layer of α-NPD, a 30 nm thick organic light emitting layer of a matrix material with embedded light emitting small molecules, and a 50 nm thick electron transporting layer of TPBI. People skilled in the art may chose alternative electroluminescent layer stack with additional layers or with a lower number of layer or even with a single organic light emitting layer within the present invention. Vacuum evaporation is a deposition technology, where the materials to be deposited follow a straight path from the evaporation source to the substrate, leading to a directed deposition. The electroluminescent layer stack 4 is structured by a shadow mask M shielding the areas of the substrate electrode 3 underneath the shadow mask indicated by the dashed line, which shall not be coated with the electroluminescent layer stack 4.

Figure 2:
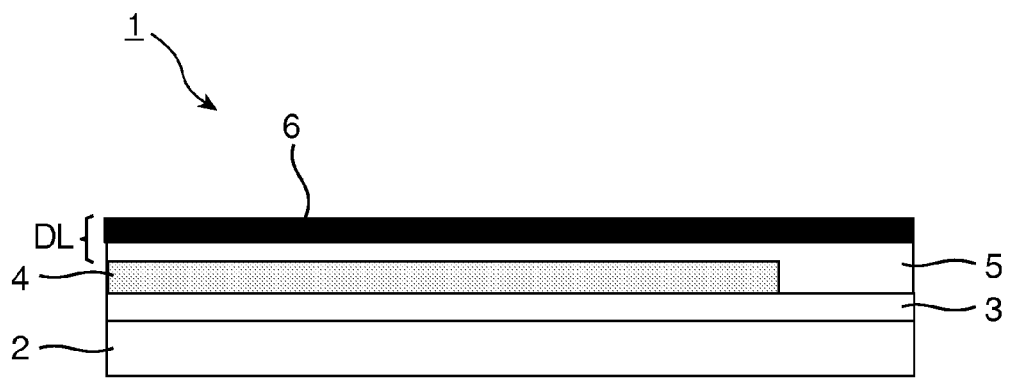
FIG. 2 schematic cross-sectional view of an organic electroluminescent device according to the present invention after deposition of the counter electrode and short prevention layer.

FIG. 2 is a schematic cross-sectional view of an organic electroluminescent (OLED) device after deposition of the counter electrode 5 and the short prevention layer 6 on top of the electroluminescent layer stack. As an example the counter electrode 5 is an aluminum layer with a thickness of 100 nm evaporated on top of the organic electroluminescent layer stack 4. On top of the counter electrode 5 a short prevention layer 6 made of copper is prepared with a layer thickness of 100 nm. The short prevention layer 6 and the counter electrode 5 form an adhering double layer DL with a tensile stress TS induced by the preparation conditions of the short prevention layer 6 of copper, here vacuum evaporation, and the selected layer thickness, here 100 nm. The tensile stress would roll-up the double layer DL in case of weak adhesion of the counter electrode 5 to the layers underneath, here the organic electroluminescent layer stack 4. To avoid a roll-up of the double layer DL at areas not disturbed by any cuts, the tensile stress of the short prevention layer 6 is adjusted to be not sufficient to roll-up the double layer DL after deposition of the short prevention layer 6 on top of the counter electrode 5. No shadow mask was used for the deposition of the double layer DL. Therefore the double layer DL extend to the area of the substrate electrode 3 not previously covered by the electroluminescent layer stack 4 providing a direct electrical contact between the substrate electrode 3 and the counter electrode making the OLED non-operational at this intermediate step of production. However, the effort and the requirements of accuracy for the deposition process of the double layer are reduced leading to a cheaper and more reliable deposition process. The failure rate due to misaligned layers is prevented for this process step leading to an increased manufacturing yield.

Figure 3:
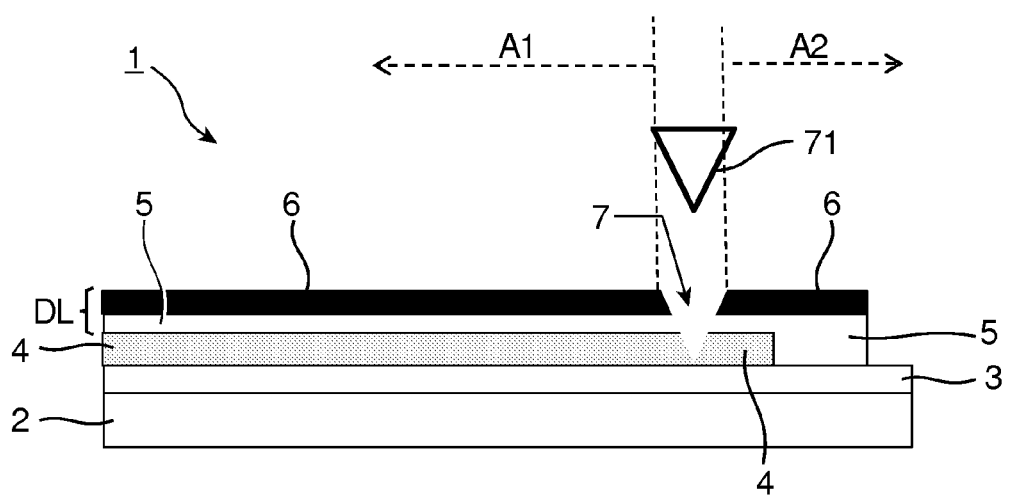
FIG. 3 schematic cross-sectional view of an organic electroluminescent device according to the present invention with introduced cut.

FIG. 3 shows a schematic cross-sectional view of an organic electroluminescent device according to the present invention with introduced cut 7. The cut 7 divides the double layer DL of counter electrode 5 and short prevention layer 6 in a first area A1 (dashed arrow) electrically isolated from the substrate electrode 3 and a second area A2 (dashed arrow) electrically connected to the substrate electrode 3 (the electrodes are shortened). The fraction of the electroluminescent layer 4 located underneath the second area A2 of the double layer DL cannot emit light, because the electrodes are shortened. The electroluminescent layer stack 4 underneath the first area A2 of the double layer DL can be operated as usual providing light emission from this part of the OLED since both electrodes are electrically isolated from each other by the introduced cut 7 and can be connected separately to a power supply in order to apply an operation voltage to the electrode. The cut 7 has to be introduced at least into (through) the double layer DL. Here, the cut 7 extends down to the substrate electrode 3. The cut 7 might be introduced by any suitable cutting means 71 to disconnect the double layer located in first and second areas A1, A2 within the scope of this invention. As an example mechanical cutting means 71 might be a scalpel. The mechanical cutting process may be executed automatically by a suitable cutting machine equipped with a scalpel. Alternatively, cutting means 71 might be suitable laser for laser cutting the double layer. The advantage of laser techniques is the contactless cutting process providing the option of leaving the other layers underneath undamaged. Also the shape of the cut 7 and the shape of the cutting line can be adjusted as desired by the applied laser parameter such as focus diameter, laser power, process speed and process intervals (like double scanning etc.). A laser cut 7 can be prepared very fast improving the manufacturing speed for an organic electroluminescent device. In a preferred embodiment, laser ablation (a special field of laser cutting) can be applied, if the cut 7 shall penetrate only through a few layers leaving the other layers underneath undamaged.

Figure 4:
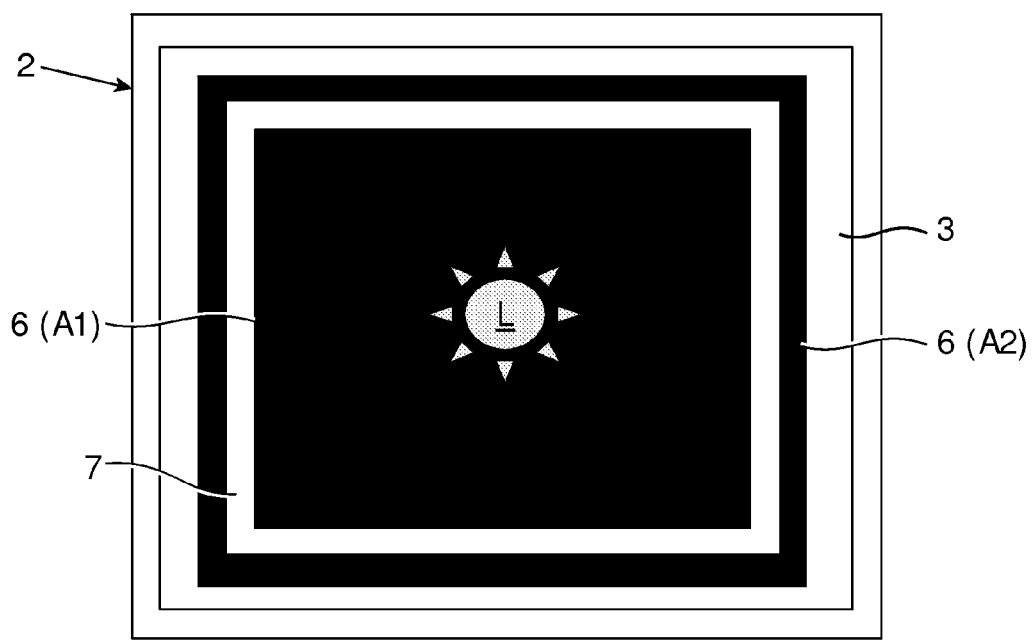
FIG. 4 schematic top view of an organic electroluminescent device according to the present invention with introduced cut.

FIG. 4 shows a schematic top view of an OLED device 1 according to the present invention with introduced cut 7. The cut 7 is a closed line, here a rectangular line forming an outer rim of the light emitting first area A2. The light emitting area is indicated in FIG. 4 with the sun symbol indicated with an L. The substrate 2 is partly covered by the substrate electrode 3. The substrate electrode 3 is partly covered by the double layer DL, where only the short prevention layer 6 as the uppermost layer is shown. The closed cut 7 divides the double layer (here the short prevention layer 6 on top of the counter electrode) into the second area A2 (outer area) and the first area A1 (inner area), which is now able to emit light L.

Figure 5:
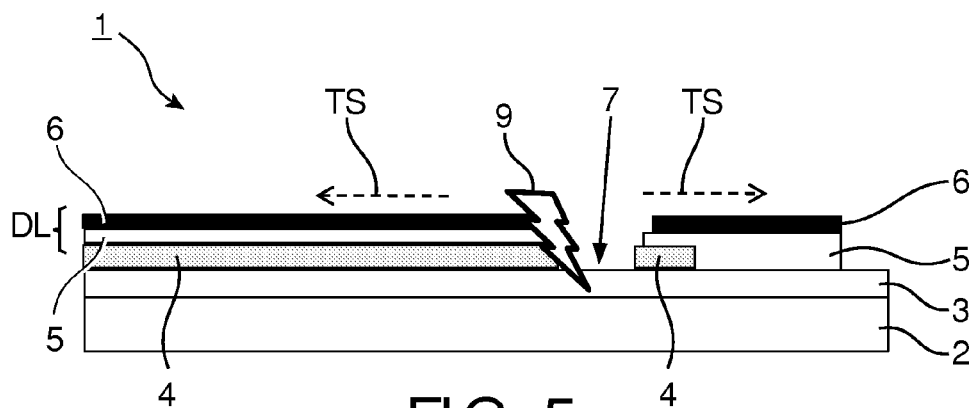
FIG. 5 schematic cross-sectional view of an organic electroluminescent device according to the present invention after introducing the cut.

However, without any additional layers such as deposited electrical isolation layers on top of the short prevention layer 6, the risk of shorts 9 occurs at the edges of the layers along the cut 7, as shown in FIG. 5. Between the cathode layer 5 and the substrate electrode layer 3, 2-10 V are applied during operation of the organic electroluminescent device. Such voltages lead to an electrical field in the organic layers of 20-100 kV/mm depending on the thickness of the electroluminescent layer stack and the applied voltage. The organic layers can be considered as a semiconductor with a very high resistivity. There is a critical area around the cut 7 since the organic electroluminescent layer 4 does not isolate the counter electrode 5 from the substrate electrode 3. The surface of the conducting substrate electrode 3 is exposed to the environmental gas along the cut 7, which has a much lower dielectric constant than the organic layers resulting in a breakdown field along the cut 7 much lower than for the organic layers causing a short 9 between the counter electrode 5 and the substrate electrode 3 along the cut 7 during operation. Such short 9 will destroy the OLED device 1. Without any additional measures, the small radius of curvature of the counter electrode 3 at the edge of the cut 7 dramatically concentrates the electrical field at the edge of the layers leading to a short 9.

Figure 6:
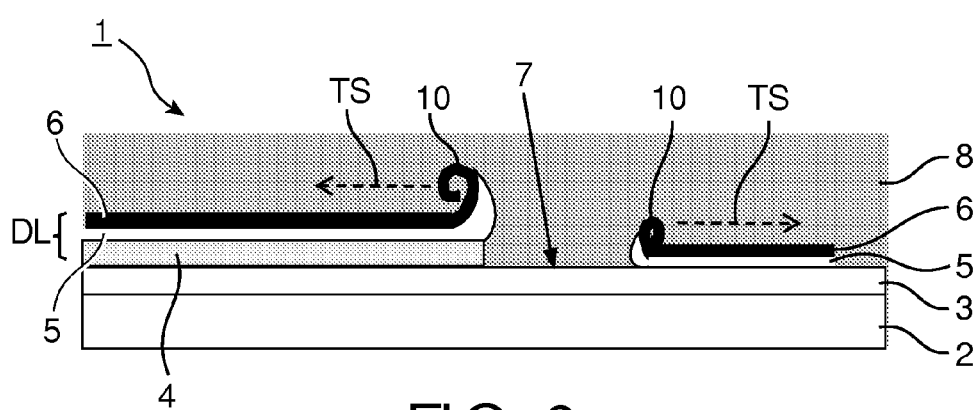
FIG. 6 schematic cross-sectional view of an organic electroluminescent device according to the present invention comprising the electrical isolating layer and rolled-up double layer in the vicinity of a cut.

FIG. 6 shows an electroluminescent device according to the present invention, where the short prevention layer 6 and the counter electrode 5 are covered with an electrically isolating layer 8 deposited on top of the double layer DL of short prevention layer 6 and counter electrode 5. Since the viscosity of the electrically isolation layer 8 is low when deposited on top of the layer stack, the electrically isolating layer 8 is able to cover also the area around and inside the cut 7 preventing a current flowing from rolled-up counter electrode 5 to substate electrode 3 at the edges of the cut 7 within the layer structure. The electrically isolating layer 8 dissolves parts of the organic electroluminescent layer stack 4 and thus weakens the adhesion of the counter electrode 5 to the organic layers 4 underneath the counter electrode 6. For the areas with weakend adhesion of the counter electrode 5 to the organic layers 4 underneath the counter electrode 5 the tensile stress TS (dashed arrow) induced by the short prevention layer 6 is sufficient to roll-up 10 the double layer DL of counter electrode 5 and short prevention layer 6. The electroluminescent layer 4 present under the second area A2 of the double layer DL might vanish completely during the dissolving process caused by the electrically isolating layer 8, as can be derived from a comparison of FIGS. 5 and 6.

The roll-up 10 is the required shaping of the counter electrode edge to avoid shorts 9 between counter electrode 5 and substrate electrode 3. The shape (similar to a so-called Rogowski-profile) guarantees that the electric field at the counter electrode edge is never larger than the average electrical field in the undisturbed organic electroluminescent layer stack 4. Thus, a complete avoidance of the field-strength enhancement is possible. The shaping (roll-up) of the counter electrode as shown in FIG. 2 fully avoids the occurrence of short 9 at the edges of a cut 7:

Firstly, the counter electrode 5 is made of e.g. Aluminum or Silver in direct contact to organic layers 4, Secondly, a layer of a harder metal, which has a build-in stress stronger than the soft Aluminum is deposited on top of the counter electrode 5 as the short prevention layer 6. Copper was preferably used in the tests, but other metals like Manganese are also suitable. Also non-metallic layers with a high tensile stress like e.g. MgF can be used. Care has to be taken to adjust the thickness of this layer such that the tensile stress does not exceed the adhesion of the counter electrode to the organic layers, since this would lead to a complete de-lamination of the counter electrode. As an example, such effect may occur for Manganese layers of more than 50 nm thickness, Thirdly, the present layer structure is coated with a polymer solution, e.g. an isolating lacquer or spray in the simplest case, as the electrically isolating layer 8.

The solvents or reactive materials in the coating dissolve the organic layers in the vicinity of the cut 7. Where the counter electrode layer 5 is intact, the attack (dissolving of layers) of the solvents or reactive materials is prevented. The interaction of the solvents with the organic layers 4 detaches the counter electrode metal 5 locally in the vicinity of the cut 7. Then, the induced stress—due to the short prevention layer 6—cause the rolling-up 10 of the double layer DL of counter electrode and short prevention layer away from the substrate electrode 3 reducing the electric field strength along the cut 7.

The new geometry of a rolled-up double layer DL reduces the electrical field along a cut 7 significantly. The free space created between the detached rolled-up double layer DL is filled with the electrically isolating layer 8 isolating the two electrodes reliably.

As an example the electrically isolating layer 8 is made of an isolating lacquer spray (URETHAN 71 spray from Farnell) with a layer thickness of 2 micrometer. The coating is cured thermally, by heating the OLED to 60° C. for 30 min and drying in vacuum for 1 h. Because the counter electrode 5 is detached along the cut, the outermost area of the electroluminescent layer stack not covered by the counter electrode after rolling-up will not emit light. After drying of the lacquer layer, the device was normally operated, and no breakthrough could be initiated.

The previously described embodiments comprise an organic electro luminescent layer stack 4. All previously described processes are also valid, if the electroluminecent layer stack contains only one organic light emitting layer 4.

LIST OF REFERENCE SIGNS

1 organic electroluminescent device (OLED)
2 substrate
3 substrate electrode
4 electroluminescent layer stack, at least one organic light emitting layer
5 counter electrode
6 short prevention layer
7 cut
71 cutting means
8 electrically isolating layer
9 electrical short at the edge of layers along a cut
10 rolled-up double layer in the vicinity of a cut
DL double layer
TS tensile stress
L light emitting area
M shadow mask

The invention claimed is:

1. An organic electroluminescent device comprising a substrate, a substrate electrode on top of the substrate, an electroluminescent layer stack with at least one organic light emitting layer on top of the substrate electrode, a counter electrode at least covering the electroluminescent layer stack, and a short prevention layer covering the counter electrode establishing a double layer (DL) of counter electrode and short prevention layer, and an electrically isolating layer at least partly on top of the short prevention layer, where a tensile stress (TS) is induced in the double layer (DL) by the short prevention layer, which is suitable to roll-up the double layer (DL) after deposition of the electrically isolating layer adjacent to a cut introduced at least to the double layer (DL) in an area, where the double layer (DL) is arranged on top of the electroluminescent layer stack suitable to electrically disconnect the counter electrode from the substrate electrode, where the electrically isolating layer at least partly covers the area of the double layer with the introduced cut to partly dissolve the electroluminescent layer stack at the cut weakening the adhesion of the double layer to the electroluminescent layer stack adjacent to the cut to roll-up the double layer in the vicinity of the cut.

2. The organic electroluminescent device according to claim 1, wherein the cut forms a closed line within the area of the double layer arranged close to the outer edge of the area covered by the electroluminescent layer stack.

3. The organic electroluminescent device according to claim 1 wherein the short prevention layer comprises at least one material selected from the group consisting of manganese, copper, magnesium fluoride, silver, and combinations thereof.

4. The organic electroluminescent device according to claim 1, wherein the short prevention layer has a layer thickness adapted to provide the suitable stress (TS) to roll up the counter electrode adjacent to the cut after deposition of the isolating layer.

5. The organic electroluminescent device according to claim 1, wherein the thickness of the counter electrode is below 140 nm.

6. The organic electroluminescent device according to claim 1, wherein the electrically isolating layer has a layer thickness of at least 1 micrometer.

7. The organic electroluminescent device according to claim 1, wherein the electrically isolating layer is a polymer layer initially comprising solvents or reactive components.

8. A method to manufacture an organic electroluminescent device according to claim 1, comprising the step of
providing a substrate covered with a substrate electrode,
depositing a electroluminescent layer stack 4 on top of the substrate electrode partly covering the substrate electrode, preferably with a mask defining the substrate electrode area being covered by the electroluminescent layer stack,
depositing a counter electrode at least covering the electroluminescent layer stack,
depositing a short prevention layer on top of the counter electrode introducing a tensile stress (TS) to a double layer (DL) of counter electrode and short prevention layer suitable to roll-up the double layer adjacent to a cut introduced at least to the double layer,
introducing the cut to at least the double layer (DL) in an area, where the double layer (DL) is arranged on top of the electroluminescent layer stack, preferably close to the outer edge of the area of the electroluminescent layer stack,
depositing an electrically isolating layer on top of the double layer (DL) at least covering the area of the double layer, where the cut was introduced,
dissolving the electroluminescent layer stack (4) arranged between substrate electrode and counter electrode adjacent to the cut by the previously deposited electrically isolating layer to weaken the adhesion of the double layer to the electroluminescent layer stack adjacent to the cut,
rolling-up of the double layer (DL) in the vicinity of the cut, and
hardening or curing of the electrically isolating layer.

9. The method according to claim 8, wherein the step of introducing the cut comprises mechanical cutting and/or laser cutting by laser ablation of at least the double layer.

10. The method according to claim 8, wherein the cut forms a closed line within the area of the double layer arranged close to the outer edge of the area covered by the electroluminescent layer stack.

11. The method according to any of claims 8, wherein the short prevention layer is deposited by vacuum evaporation.

12. The method according to claim 8, wherein the electrically isolating layer is fully covering the counter electrode and the short prevention layer.

13. The method according to claim 8, wherein the electrically isolating layer is deposited by spray coating or by screen printing or tampon printing.

14. The method according to claim 13, further comprising the step of curing the electrically isolating layer after deposition via exposure of the deposited electrically isolating layer to ultra violet light and/or enhanced temperature.

15. The organic electroluminescent device to claim 4, wherein the short prevention layer has a thickness of more than 20 nm.

16. The organic electroluminescent device according to claim 1, wherein the thickness of the counter electrode is between 10 and 100 nm.

17. The organic electroluminescent device according to claim 1, wherein the electrically isolating layer has a layer thickness of more than 5 micrometer.

* * * * *